US 6,600,671 B2

(12) United States Patent
Keeth

(10) Patent No.: US 6,600,671 B2
(45) Date of Patent: Jul. 29, 2003

(54) REDUCED AREA SENSE AMPLIFIER ISOLATION LAYOUT IN A DYNAMIC RAM ARCHITECTURE

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/225,908

(22) Filed: Aug. 21, 2002

(65) Prior Publication Data

US 2002/0191461 A1 Dec. 19, 2002

Related U.S. Application Data

(62) Division of application No. 10/121,805, filed on Apr. 12, 2002, which is a continuation of application No. 08/519,504, filed on Aug. 25, 1995.

(51) Int. Cl.[7] .................................................. G11C 5/02
(52) U.S. Cl. .......................................... 365/51; 365/207
(58) Field of Search ................................... 365/51, 207

(56) References Cited

U.S. PATENT DOCUMENTS

| 5,127,739 A | | 7/1992 | Duvvury et al. ........ 365/189.11 |
| 5,151,375 A | | 9/1992 | Kazerounian et al. ........ 437/43 |
| 5,323,350 A | * | 6/1994 | Mclaury ..................... 365/208 |
| 5,394,354 A | | 2/1995 | Watabe et al. ................ 365/51 |
| 5,396,450 A | | 3/1995 | Takashima et al. ........... 365/51 |
| 5,427,966 A | | 6/1995 | Komori et al. ................ 437/43 |

FOREIGN PATENT DOCUMENTS

| EP | 0 544 320 A2 | 6/1993 |
| EP | 0 564 813 A1 | 10/1993 |

OTHER PUBLICATIONS

Takashima et al., "Open/Folded Bit–Line Arrangement for Ultra High–Density DRAMs", *VLSI Circuits Symposium*, pp. 89–90, 1993.

Takashima et al., "Open/Folded Bit–Line Arrangement for Ultra High–Density DRAMS", *IEEE Journal of Solid–State Circuits*, vol. 29, No. 4, pp. 539–542, Apr. 1994.

* cited by examiner

*Primary Examiner*—M. Tran
(74) *Attorney, Agent, or Firm*—Dorsey & Whitney LLP

(57) ABSTRACT

A memory device has an array of memory cells which are positioned in a first block and a second block. The memory cells are arranged in rows and columns. A plurality of bit lines is coupled to the memory cells and a plurality of word lines is coupled to the memory cells. A sense amplifier is positioned between the first block and the second block, and a plurality of electrical connections is made between the sense amplifier and the bit lines. A plurality of isolation transistors are electrically connected in series with the electrical connections, the isolation transistors being located within the first and second blocks and spaced from the sense amplifier block.

10 Claims, 6 Drawing Sheets

US 6,600,671 B2

REDUCED AREA SENSE AMPLIFIER ISOLATION LAYOUT IN A DYNAMIC RAM ARCHITECTURE

CROSS-REFERENCE TO RELATED APPLICATIONS

This application is a divisional of pending U.S. patent application Ser. No. 10/121,805, filed Apr. 12, 2002, which is a continuation of pending U.S. patent application Ser. No. 08/519,504, filed Aug. 25, 1995.

TECHNICAL FIELD

This invention relates to an integrated circuit memory device, and more particularly to a sense amplifier isolation circuit layout using reduced die area over current layouts in a dynamic RAM architecture.

BACKGROUND OF THE INVENTION

A dynamic random access memory (DRAM) that occupies the smallest silicon area for the largest storage capacity is preferred. Using a small silicon area permits smaller chips to be made of a high DRAM density and also permits more chips to be made on a single wafer. This reduces the cost of DRAM manufacture while at the same time increases the production.

A DRAM chip includes a number of distinct circuits such as: memory cells for storing data, sense amplifiers for reading data from the memory cell and circuits to permit data input and output to and from the memory.

Many identical copies of certain circuits, such as the memory cells and sense amplifiers, are required on a single DRAM. Even a small reduction in the area of such circuits can result in a significant reduction in overall chip area. Some of today's DRAMs have many hundreds or even many thousands of identical sense amplifier circuits. A modest reduction in the layout area required by a sense amplifier will thus be multiplied by the number of sense amplifiers on the chip to provide a reduction of total memory size.

Reducing the size of a sense amplifier can be somewhat difficult from an operational standpoint. In a typical DRAM memory cell, the charge difference between a high and a low is very small, typically one million electrons or even less. Consequently, the sense amplifier must be able to sense a very small differential voltage between bit line pairs BL and BL*. Maximizing the sense amplifier's speed and reliability is important to ensure proper operation of the DRAM. If the area is reduced too much, speed and reliability both suffer. It has thus been difficult in the prior art to reduce the overall area required for a sense amplifier while maintaining the necessary speed and reliability.

A block diagram of a typical prior art DRAM integrated circuit is shown in FIG. 1. Such a memory device has a plurality of memory cells MC arranged in rows and columns and located in memory array blocks 11 and 13. Each block 11 and 13 includes a plurality of word lines WL arranged in rows, and a plurality of bit line pairs BL and BL* arranged in columns. Each memory cell MC is accessed via a word line WL and outputs data onto a bit line BL or BL*. The area adjacent the last row of memory cells MC at the edge of the block may be reserved for dummy cells or redundancy memory cells. Alternatively, the area adjacent the memory cells MC at the edge of a block may remain unused, thus representing a great sacrifice of precious die area.

As known to those skilled in the art and as shown in FIG. 1, a sense amplifier 9 is located outside memory array blocks 11 and 13. A typical prior art sense amplifier 9 includes a number of sense amplifier components 15 as well as isolation devices 17. These isolation devices 17 isolate block A from the sense amplifier 9 when reading from or writing to block B and isolate block B from the sense amplifier 9 when reading from or writing to block A, respectively. The isolation devices in prior art sense amplifiers may be full transmission gates having an NMOS transistor and a PMOS transistor. A typical sense amplifier also includes the following sense amplifier components: an equalization circuit (not shown); a bias circuit (not shown); cross-coupled amplifiers (not shown); and input/output devices (not shown). Bit line pairs 31 and 33 may be connected to sense amplifiers (not shown) at the other sides of memory blocks 11 and 13, respectively.

It would be desirable to minimize DRAM layout by minimizing the layout of sense amplifiers. As will be appreciated, the sheer number of components included in a sense amplifier, coupled with strict design rules intended to prevent the occurrence of errors, makes reduction of the sense amplifier components very difficult. For example, an active pull-up transistor in a typical sense amplifier may occupy up to six times the die area occupied by a transistor in a memory cell. Such a sense amplifier transistor is sized to match specific functions and cannot be reduced in size. Other transistors located in the sense amplifier block must be size matched as well and thus these transistors cannot be reduced in size.

SUMMARY OF THE INVENTION

The present invention reduces sense amplifier size beyond the constraints imposed by design rules in the sense amplifier, therefore saving precious die area. A layout according to the present invention relocates portions of the sense amplifier, such as the sense amplifier isolation devices, into the rows of memory cells at the edge of a memory array. Some of the circuit elements of the sense amplifiers are thus located within the densely laid out memory array block rather than within the sense amplifier circuit area, even though they are traditionally considered part of the sense amplifier circuit.

In a first embodiment of the present invention, a memory device has an array of memory cells which are positioned in a first block and a second block on either side of the sense amplifiers. The memory cells are arranged in rows and columns. A plurality of bit lines is coupled to the memory cells and a plurality of word lines is coupled to the memory cells. A row of sense amplifiers is positioned between the first block and the second block, one for each pair of bit lines and a plurality of electrical connections is made between the respective sense amplifier and the bit lines in each block. An isolation transistor is electrically connected in series between the bit lines and the rest of the circuits in the sense amplifier for that particular bit line. A plurality of isolation transistors, one for each bit line, are positioned in a row at the edge of the memory array. An isolation control signal provides a gate voltage to the isolation transistors to connect the bit lines of the respective blocks to the sense amplifiers at a selected time.

A sense amplifier layout as described above significantly reduces sense amplifier layout area, by up to 30% over prior art sense amplifier designs.

A second embodiment of the present invention uses full transmission gates, having an NMOS transistor and a PMOS transistor, as isolation transistors instead of an NMOS transistor with a boosted gate voltage. The PMOS transistor is located within the sense amplifier block area and spaced from the memory cell array, while the NMOS transistor is located within the first and second blocks of memory cell array.

DETAILED DESCRIPTION OF THE INVENTION

Figure 1:
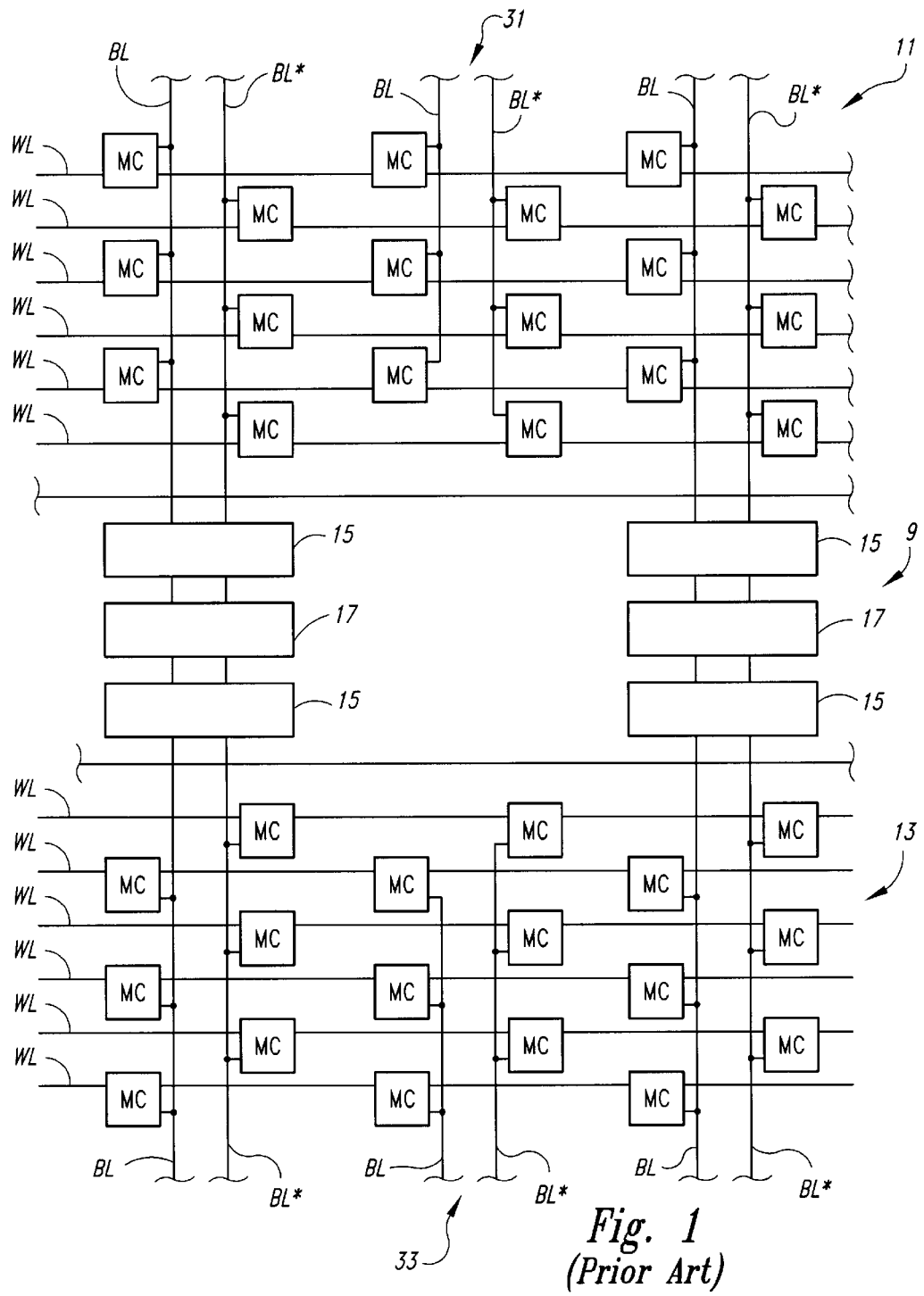
FIG. 1 is a block diagram of a typical prior art DRAM memory device.
Figure 2:
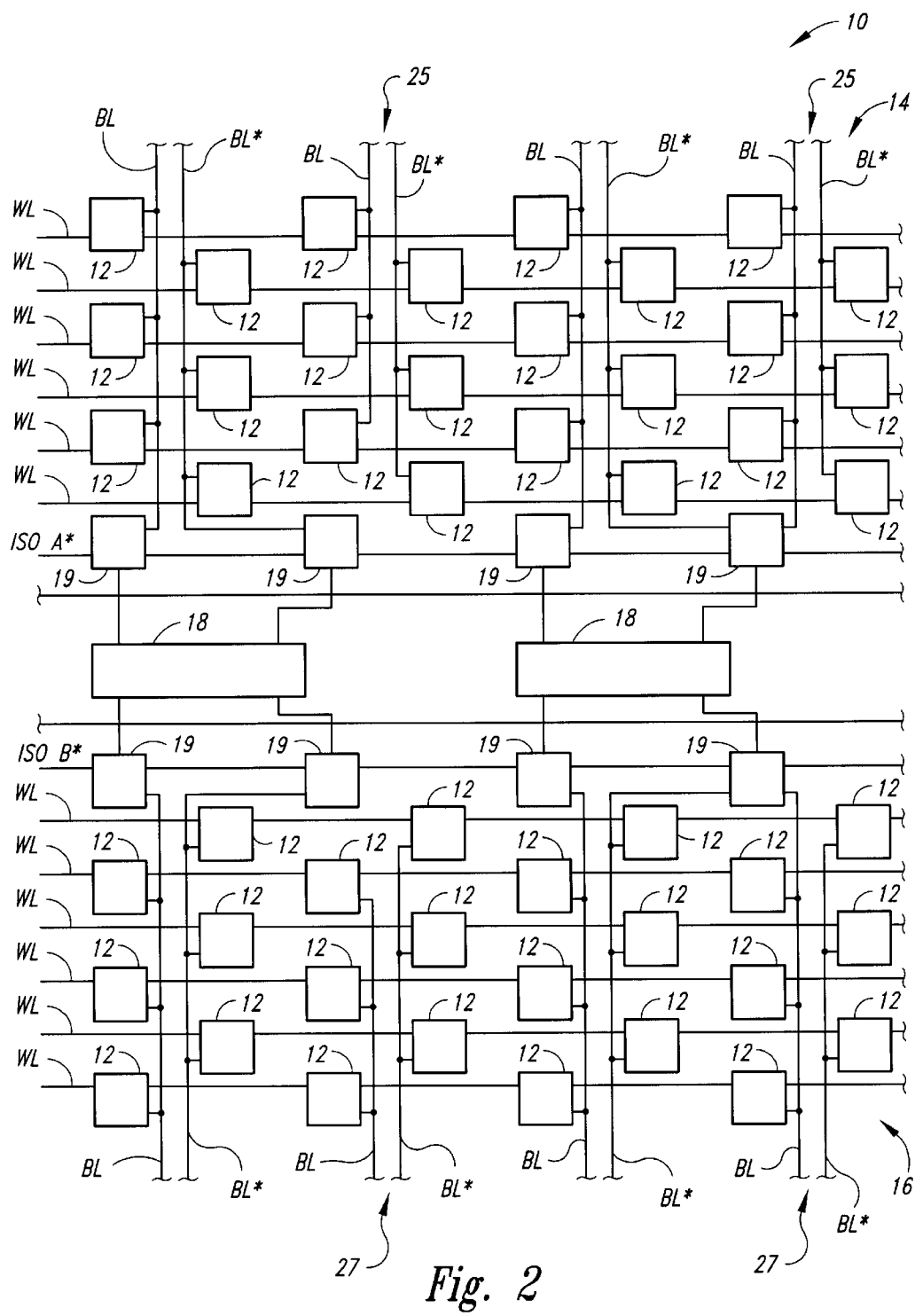
FIG. 2 is a block diagram of a DRAM memory device of a preferred embodiment of the present invention.

FIG. 2 shows a block diagram of a DRAM memory device with a minimized layout according to a preferred embodiment of the present invention. An array 10 of memory cells 12 is formed on a substrate of semiconductor material. The memory cells 12 are formed in a conventional manner and are arranged in rows and columns. The memory cells 12 are further positioned into blocks 14 and 16. As is known in the art, memory cells 12 in a last row within the blocks 14 and 16 may be either conventional memory cells or dummy cells. Adjacent the last row of memory cells and within the memory array block are a plurality of isolation devices 19, as will be explained in more detail later.

A preferred embodiment of the present invention includes a plurality of bit lines. The bit lines are organized into adjacent bit line pairs BL and BL*. The word lines are arranged in rows, and the memory cells 12 in a row are electrically connected to a common word line WL, as is also known in the art.

As shown in FIG. 2, a plurality of sense amplifiers 18 are positioned between the memory blocks 14 and 16. Each sense amplifier 18 contains a plurality of circuit elements, depending on the design, these may include circuits such as an equalization circuit, input/output devices, an n-channel cross coupled amplifier, a p-channel cross coupled amplifier, and isolation circuits. Bit line pairs 25 and 27 may be connected to sense amplifiers (not shown) at the other sides of memory blocks 14 and 16, respectively.

According to sense amplifier layouts known in the art, isolation devices 17 for the sense amplifiers 9 are positioned within the sense amplifier circuit blocks in the layout. However, according to the present invention, the isolation devices 19 for the sense amplifiers 18 are not located within the sense amplifier blocks, but instead are located within the memory array blocks 14 and 16. Specifically, a preferred embodiment of the present invention puts to use as isolation devices 19 the last row of partial memory cells in the blocks 14 and 16 that are typically unused in the prior art.

Figure 3:
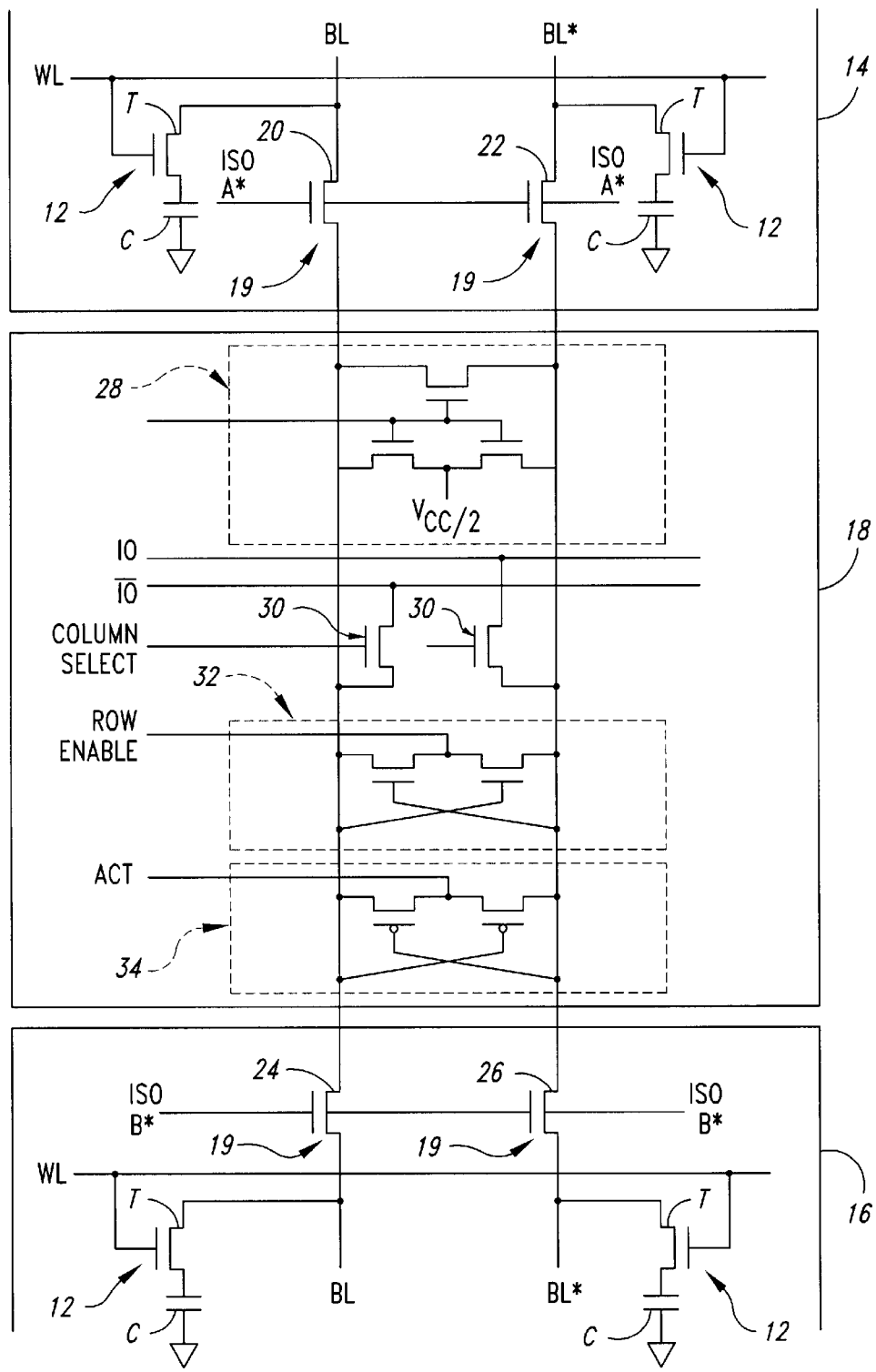
FIG. 3 is a schematic diagram of a DRAM memory device of a preferred embodiment of the present invention.

As shown in FIG. 3, the isolation device 19 for bit line segment BL of block 14 includes an n-channel transistor 20 that is part of the memory cell array. The source of transistor 20 is electrically connected in series with bit line segment BL and the rest of sense amplifier 18. The gate of transistor 20 is connected to a polysilicon gate line positioned adjacent the last word line for the memory cells of the array. The drain of transistor 20 is electrically connected in series with an input to sense amplifier 18. N-channel transistor 22 of a memory cell 12 is similarly an isolation device for bit line segment BL* of block 14. The source of transistor 22 is connected in series with bit line segment BL*. The gate of transistor 22 is also connected to the same polysilicon gate line in block 14 as the gate of transistor 20. The drain of transistor 22 is likewise connected in series with sense amplifier 18.

The isolation devices 19 for bit line segments BL and BL* of block 16 are likewise positioned adjacent the last row of memory cells 12 of block 16. Specifically, N-channel transistors 24 and 26 are isolation devices for bit line segments BL and BL*, respectively, of block 16. The sources of transistors 24 and 26 are electrically connected in series with respective bit lines and the drains are electrically connected in series with an input to sense amplifier 18. The gates of transistors 24 and 26 are connected to a common polysilicon gate line adjacent the word line WL for the last row of memory cells 12 in block 16.

The sense amplifier 18 can be one of any number of acceptable conventional circuits, formed in a known manner. Memory cells 12 are any conventional memory cell, many types being known, whose operations and structure are known. These include DRAM memory cells, SRAM, EPROM, EEPROM and the like. Details of the formation and operation of sense amplifier 18 and memory cells 12 are therefore omitted.

The operation of one embodiment of the invention is as follows. When the sense amplifier is not in an active read or write cycle, the gates of the isolation transistors are kept high, to enable the isolation devices. This keeps the bit lines connected to the sense amplifier so it can be properly set to perform a rear or write cycle. As a read cycle starts, the sense amplifier is set for the read cycle using timing and control signals known in the art. The address is decoded, at least sufficiently to confirm which array contains the memory being addressed. Shortly after this, the isolation transistors in the array not being addressed are disabled to disconnect the non-addressed array from the sense amplifier. After the address is further decoded, the selected word line is taken high. This causes the data to be placed on the bit lines. The gates of the isolation transistors of the non-addressed array block are kept low to ensure that any signal from the non-addressed array does not interfere with the sense amplifier's operation.

In an alternative embodiment, the isolation transistors of the non-addressed array block are disabled later in the cycle, after or at the same general time that the word line is brought high, and the gate line of the isolation transistors in the addressed block is kept high to connect the proper array to the sense amplifier.

In summary, at a selected time, the gates of transistors 20 and 22 are supplied with an isolation control signal ISO A* via their polysilicon gate line of block 14. ISO A* is a signal supplied by a control circuit that preferably has a voltage level in excess of $V_{DD}$ to provide a boosted gate voltage for transistors 20 and 22. If $V_{DD}$ has a voltage of around 5 volts, ISO A* preferably has a voltage of at least 7.5 volts. The use of boosted gate voltage for N-channel transistors 20, 22, 24 and 26 allows substantially all the voltage present on bit line segments BL and BL* to be transferred to sense amplifiers 18.

The generation of a boosted gate voltage requires a charge pump, or voltage multiplier, located in the periphery of the memory device. Such charge pumps are already present on the DRAM for other circuits. The additional circuits to obtain the voltage from a charge pump may take up some small amount of die area, but the use of a boosted gate voltage allows a single N-channel transistor 20, 22, 24, and 26 to be used as an isolation device instead of a full transmission gate. The present invention thus compensates for the additional die area occupied by the circuits to obtain voltage from a charge pump by making a PMOS transistor unnecessary as a component of an isolation device. Moreover, using a transistor in blocks 14 and 16 of memory cells 12 instead of a much larger transistor in sense amplifier 18 saves considerable die area. These two factors more than compensate for the die area occupied by circuits to obtain voltage from a charge pump.

Prior to a read or write operation on any memory cell 12 in block 14, signals ISO A* and ISO B* are high. This turns on transistors 20 and 22 and connects bit line segments BL and BL* in block 14 to sense amplifier 18. As the read signal cycle progresses, signal ISO B* is brought low, turning off transistors 24 and 26, thus isolating bit line segments BL and BL* in block 16 from sense amplifier 18. Conversely, when it is desired to read from or write to any memory cell 12 in block 16, signal ISO A* is taken low to isolate bit line segments BL and BL* in block 14 from sense amplifier 18 and signal ISO B* stays high to connect bit line segments BL and BL* in block 16 to sense amplifier 18.

As shown in FIG. 3, sense amplifier 18 includes an equalization circuit 28, input/output devices 30, an N-cross coupled amplifier 32, and a P-cross coupled amplifier 34. Of note, the isolation devices are not within the area occupied by sense amplifier 18, as are the isolation devices in prior art sense amplifiers. Accordingly, DRAM integrated circuits with isolation devices relocated to array edges according to a preferred embodiment of the present invention have sense amplifiers with a layout area reduced by up to 31.8% over sense amplifier layout areas known in the prior art.

Figure 4:
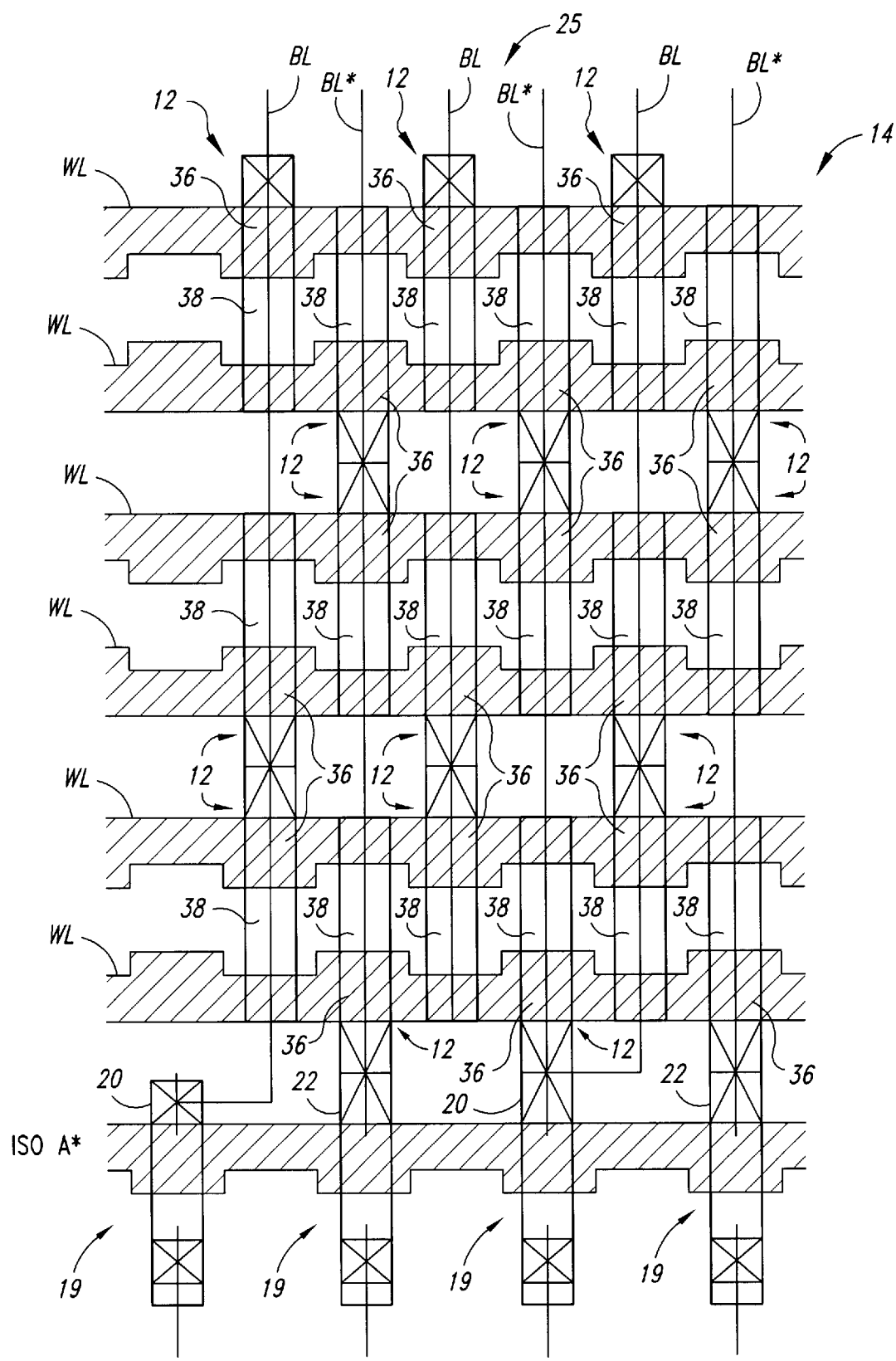
FIG. 4 is a diagram of a physical layout of an edge of a DRAM memory of a preferred embodiment of the present invention.

A physical layout of an array edge of a DRAM according to a preferred embodiment of the present invention appears in FIG. 4. As shown in FIG. 4, block 14 of memory cells 12 is formed in a substrate according to known methods. FIG. 4 and the following discussion also apply to block 16 as well as block 14. Each memory cell 12 preferably includes an n-channel transistor 36 and a capacitor 38. The gate of each transistor 36 is electrically connected to a polysilicon word line WL, which supplies a boosted gate voltage with a value greater than $V_{DD}$. The drain of each transistor 36 is electrically connected to bit line segments BL or BL*; the electrical connections to the bit line are shown in FIG. 4 at locations denoted by an "X". As shown in FIG. 4, bit line pairs 25 may be connected to a sense amplifier (not shown) at the other side of memory block 14 to increase the memory cell density on the chip.

FIG. 4 shows that block 14 has a row of memory cells 12, formed in a conventional manner, at an edge of the array. The present invention departs from DRAM layouts known in the art by relocating sense amplifier isolation devices within the array and adjacent the last row of memory cells 12 at the edge of first block 14. The gate line for the isolation transistors is immediately adjacent the word line WL for the memory cells. Indeed, it has the same (or less) spacing from the next adjacent word line WL as any word line WL does to any other word line WL.

According to a preferred embodiment of the present invention, the source of n-channel transistor 20 of a memory cell 12 is electrically connected to bit line segment BL of block 14. The gate of transistor 20 is electrically connected to the last polysilicon word line WL in block 14, which supplies isolation control signal ISO A* with a voltage level greater than $V_{DD}$. The drain of transistor 20 is electrically connected in series to an input of sense amplifier 18 (not shown). Similarly, according to a preferred embodiment of the present invention, the source of N-channel transistor 22 of a memory cell 12 is electrically connected to bit line segment BL* of block 14. The gate of transistor 22 is also electrically connected to the last polysilicon word line WL in block 14. Finally, the drain of transistor 22 is electrically connected in series to an output of sense amplifier 18 (not shown).

One significant advantage of the present invention is obtained because of the relative size of the isolation transistors formed within the memory array as compared to transistors within the sense amplifier block. Often, transistors within the sense amplifier block location in the memory are made with a particular design rule size, that is, of particular size and spacing. The minimum size and minimum spacing in the sense amplifier is usually larger than in the memory array; such design rules being based on sense amplifier design features. Many of the size and spacing features for transistors within the sense amplifier are extremely critical to ensure fast and accurate operation. Thus, it is common for the design rule of all transistors within the sense amplifier block to be larger than the design rule for transistors within the memory array. On the other hand, the design rule for transistors within the memory array is frequently the smallest possible for any transistor on the chip. Such memory array transistors are packed very tightly to achieve a dense array because there are many identical such transistors side-by-side in the same block.

According to the present invention, the isolation transistors are sized according to the design rule for transistors in the memory array. This permits such isolation transistors to be as small as possible. The isolation transistors are located on a word line within the array spaced with the same spacing as all other word lines within the array and adjacent to the last word line of each block of memory, just prior to the sense amplifier. One reason why the considerable space savings are achieved is because of the compact spacing of the isolation transistors alignment of their gate as a word line in the memory array, and the use of the smaller design rule as compared to the space that is taken up by isolation transistors in the sense amplifier block, whose gate must pass through portions of the sense amplifier block, and whose design rule is based on sense amplifier design rule considerations.

Figure 5:
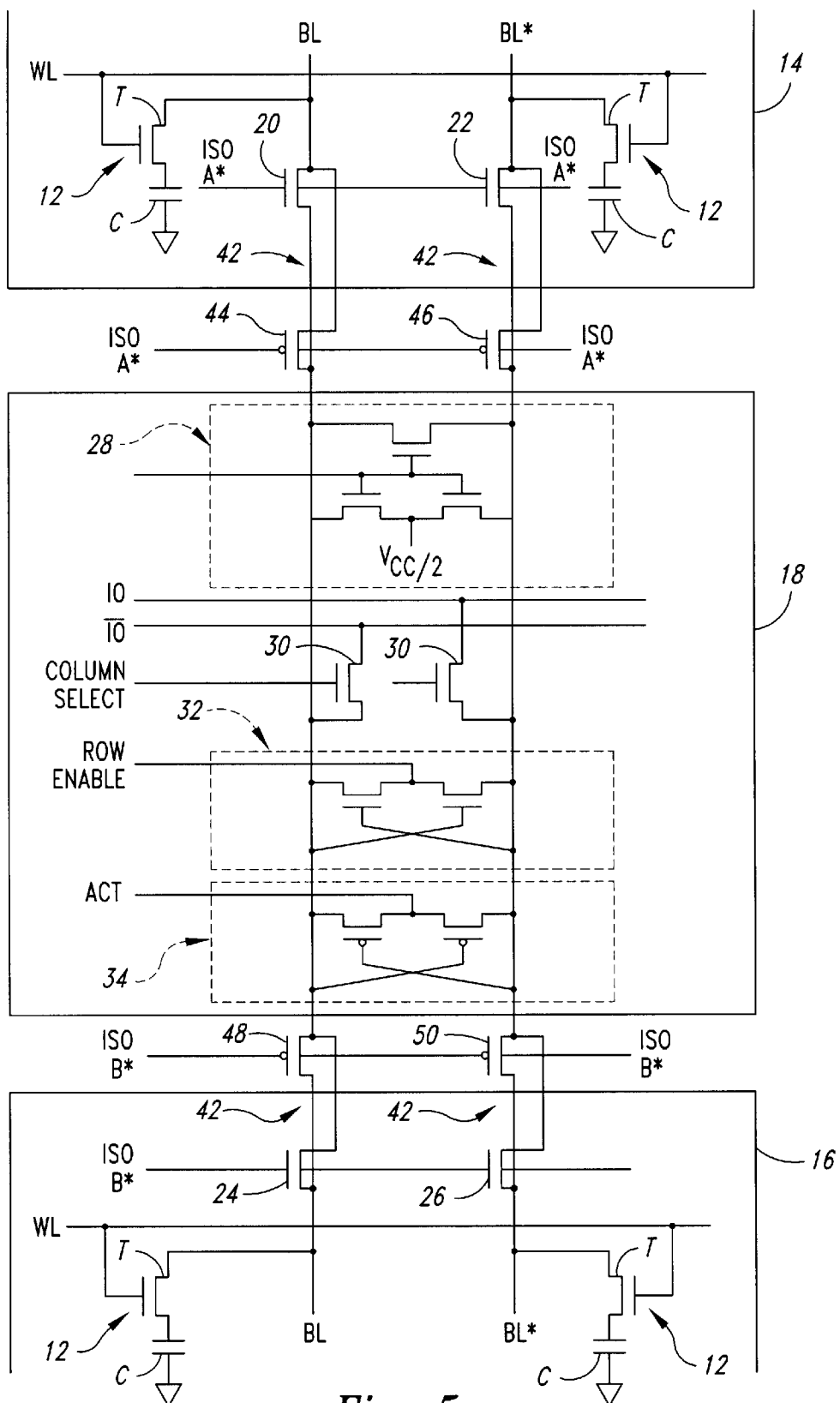
FIG. 5 is a schematic diagram of a DRAM memory device of an alternative embodiment of the present invention.

FIG. 5 shows a schematic diagram of a DRAM memory device according to an alternative embodiment of the present invention. In such an alternative embodiment, the isolation devices for the sense amplifier 18 are full transmission gates 42 having p- and n-channel transistors. In block 14, these transmission gates 42 are shown as n-channel transistor 20 and p-channel transistor 44 for bit line segment BL, and as n-channel transistor 22 and p-channel transistor 46 for bit line segment BL*. The source of transistor 20 is connected to the source of transistor 44 and is connected in series with bit line segment BL. The gate of transistor 20 is connected to isolation control signal ISO A* via the last polysilicon word line WL of block 14. The drain of transistor 20 is connected to the drain of transistor 44 and in series with sense amplifier 18. The gate of transistor 44 is connected to an isolation control signal ISO A supplied from a control circuit. N-channel transistor 22 and p-channel transistor 46 are connected in a likewise manner for bit line segment BL* in block 14. In block 16, transmission gates 42 are shown as n-channel transistor 24 and p-channel transistor 48 for bit line segment BL and as n-channel transistor 26 and p-channel transistor 50 for bit line segment BL*. N-channel transistor 24 and p-channel transistor 48 are connected for bit line segment BL of block 16 as transistors 20 and 44 are connected, and n-channel transistor 26 and p-channel transistor 50 are connected for bit line segment BL* of block 16 as transistors 22 and 46 are connected. P-channel transistors 48 and 50 are supplied with isolation control signal ISO B from a control circuit. As in the preferred embodiment of the invention, transistors 20, 22, 24, and 26 are located at edges of their respective blocks. However, p-channel transistors 44, 46, 48 and 50 are located outside the array itself because a separate n-well is required. They are positioned between the array and the sense amplifier 18. DRAM memory devices formed according to this alternative embodiment of the present invention have sense amplifier layout areas reduced by 12.5% compared to sense amplifiers made according to methods known in the art. This includes the area of the n- and p-channel transistors as being part of the sense amplifier.

Figure 6:
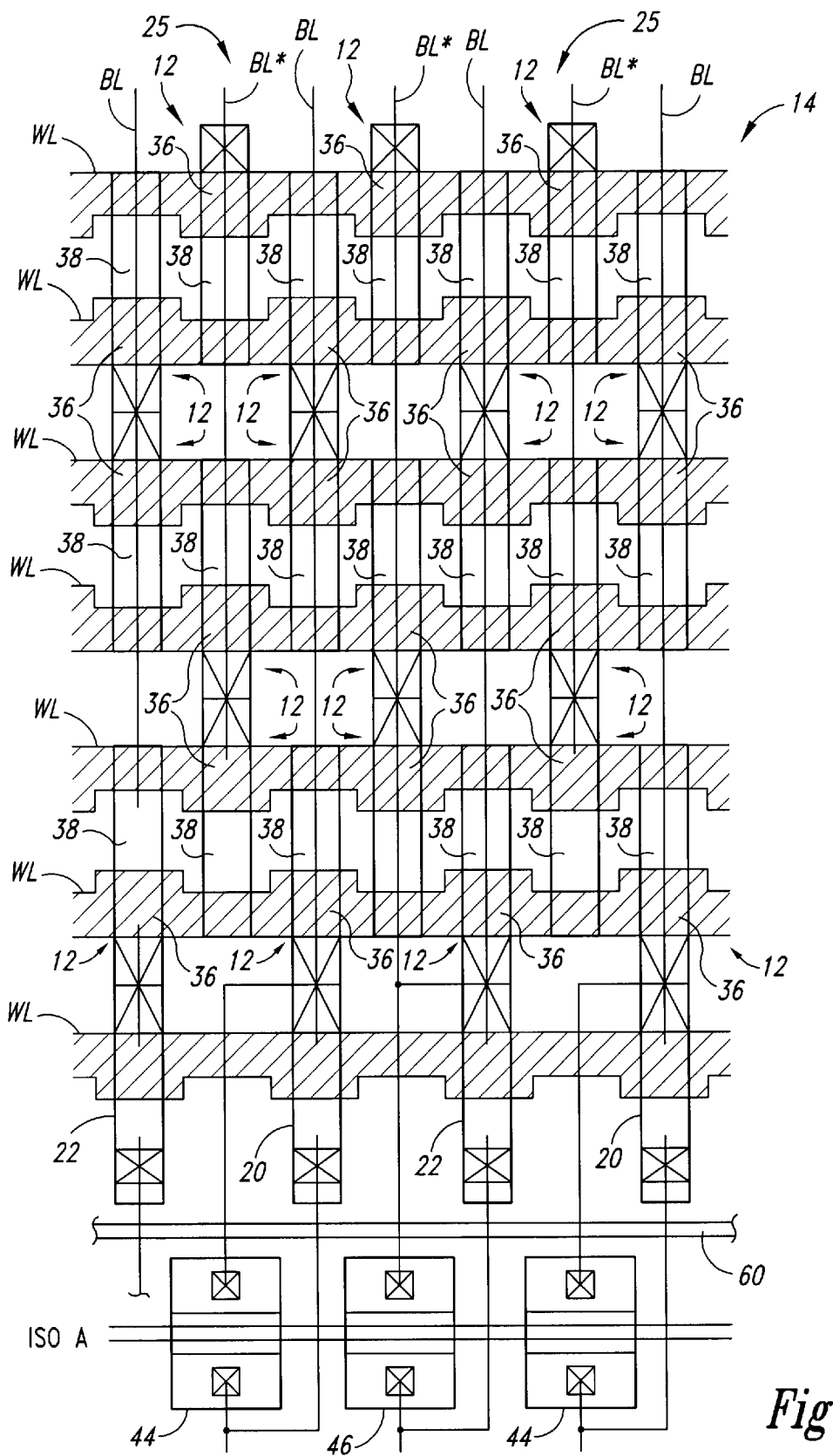
FIG. 6 is a diagram of a physical layout of an edge of a DRAM memory of an alternative embodiment of the present invention.

The physical layout of the full CMOS transmission gates is shown in FIG. 6. The DRAM array edge and the sense amplifier block are laid out similarly to those shown in FIG. 4 and described in the text accompanying FIG. 4. However, PMOS transistors 44 and 46 of transmission gates 42 are located between array block 14 and sense amplifier block 18 in a separate n-well. The gates of transistors 44 and 46 are electrically connected to a control signal ISO A via a gate line. The sources of transistors 44 and 46 are electrically connected in series with the sources of transistors 20 and 22, respectively. The drains of transistors 44 and 46 are electrically connected to the drains of transistors 20 and 22, respectively, and to sense amplifier 18 (not shown). A p-plug 60 separates the NMOS and PMOS transistors of the full CMOS transmission gates to prevent spurious noise and latch-up between the NMOS and PMOS transistor regions.

While various embodiments have been described in this application for illustrative purposes, the claims are not so limited. Rather, any equivalent method or device operating according to principles of the invention falls within the scope thereof.

What is claimed is:

1. A method for laying out a dynamic RAM, the method comprising:

providing a substrate of semiconductor material of a first conductivity type;

fabricating an array of memory cells on the substrate arranged in rows and columns, the array of memory cells being divided into first and second sub-arrays;

fabricating a plurality of bit line pairs each of which is provided for a respective column in the first and second sub-arrays;

fabricating a plurality of sense amplifiers in an area of the substrate that is physically between the first and second sub-arrays of memory cells, each of the sense amplifiers being provided for a respective column in the first and second sub-arrays; and fabricating a first plurality of isolation transistors in the substrate, each of the isolation transistors being connected between a respective one of the bit lines and one of the sense amplifiers, each of the isolation transistors being fabricated within the sub-array for which the bit line is provided.

2. The method of claim 1, further comprising fabricating a plurality of word lines coupled to gates of the memory cells and gates of the isolation transistors, the word lines being coupled to a source of a boosted gate voltage.

3. The method of claim 1, further comprising:

fabricating a second plurality of isolation transistors in the substrate, the isolation transistors in the second plurality being positioned within the sense amplifiers, the isolation transistors in the second plurality being spaced from the sub-arrays of memory cells, the isolation transistors in the second plurality and the isolation transistors in the first plurality being fabricated within the sub-arrays and being electrically connected such that the isolation transistors form full transmission gates.

4. A method for laying out a dynamic RAM, the method comprising:

providing a substrate of semiconductor material of a first conductivity type;

fabricating an array of memory cells on the substrate arranged in rows and columns, the memory cells being fabricated using a first design rule;

fabricating a plurality of bit line pairs each of which is provided for a respective column in the array;

fabricating a plurality of sense amplifiers in the substrate for respective columns in the array, the sense amplifiers being fabricated using a second design rule that is larger than the first design rule; and fabricating a first plurality of isolation transistors in the substrate using the first design rule, each of the isolation transistors being connected electrically between a respective one of the bit lines and one of the sense amplifiers.

5. The method of claim 4, further comprising fabricating a plurality of word lines coupled to gates of the memory cells and gates of the isolation transistors, the word lines being coupled to a source of a boosted gate voltage.

6. The method of claim 4, further comprising:

fabricating a second plurality of isolation transistors in the substrate, the isolation transistors in the second plurality being positioned within the sense amplifiers, the isolation transistors in the second plurality being spaced from the array of memory cells, the isolation transistors in the second plurality and the isolation transistors in the first plurality being fabricated within the first design rule and being electrically connected such that the isolation transistors form full transmission gates.

7. The method of claim 6 wherein the isolation transistors in the second plurality are fabricated using the second design rule.

8. The method of claim 6 wherein the act of fabricating an array of memory cells on the substrate comprises fabricating the array of memory cells so that they are divided into first and second sub-arrays that are physically separate from each other, and wherein the act of fabricating the isolation transistors using the first design rule comprises fabricating each of the isolation transistors within one of the first and second sub-arrays.

9. The method of claim 4, wherein the act of fabricating a plurality of sense amplifiers in the substrate comprises fabricating the sense amplifiers in the substrate so that they are physically positioned between the first and second sub-arrays.

10. The method of claim 6 wherein the act of fabricating an array of memory cells on the substrate comprises fabricating the array of memory cells so that they are divided into first and second sub-arrays that are physically separate from each other, and wherein the act of fabricating a plurality of sense amplifiers in the substrate comprises fabricating the sense amplifiers in the substrate so that they are physically positioned between the first and second sub-arrays.

* * * * *